United States Patent
Lue

(10) Patent No.: US 8,432,719 B2
(45) Date of Patent: Apr. 30, 2013

(54) THREE-DIMENSIONAL STACKED AND-TYPE FLASH MEMORY STRUCTURE AND METHODS OF MANUFACTURING AND OPERATING THE SAME HYDRIDE

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 213 days.

(21) Appl. No.: 13/008,384

(22) Filed: Jan. 18, 2011

(65) Prior Publication Data
US 2012/0182807 A1  Jul. 19, 2012

(51) Int. Cl.
*G11C 11/00* (2006.01)
(52) U.S. Cl.
USPC ........... 365/130; 365/129; 365/181; 365/173; 365/185.14; 365/185.26
(58) Field of Classification Search .................. 365/130, 365/129, 181, 173, 185.14, 185.26
See application file for complete search history.

(56) References Cited

U.S. PATENT DOCUMENTS

2009/0310425 A1* 12/2009 Sim et al. ................. 365/185.29
2010/0265773 A1  10/2010 Lung et al.

* cited by examiner

*Primary Examiner* — Thong Q Le
(74) *Attorney, Agent, or Firm* — McClure, Qualey & Rodack, LLP

(57) ABSTRACT

A 3D stacked AND-type flash memory structure comprises several horizontal planes of memory cells arranged in a three-dimensional array, and each horizontal plane comprising several word lines and several of charge trapping multilayers arranged alternately, and the adjacent word lines spaced apart from each other with each charge trapping multilayer interposed between; a plurality of sets of bit lines and source lines arranged alternately and disposed vertically to the horizontal planes; and a plurality of sets of channels and sets of insulation pillars arranged alternatively, and disposed perpendicularly to the horizontal planes, wherein one set of channels is sandwiched between the adjacent sets of bit lines and source lines.

23 Claims, 18 Drawing Sheets

THREE-DIMENSIONAL STACKED AND-TYPE FLASH MEMORY STRUCTURE AND METHODS OF MANUFACTURING AND OPERATING THE SAME HYDRIDE

BACKGROUND

1. Field of the Invention

The disclosure relates in general to a three-dimensional (3D) flash memory structure and methods of manufacturing and operating the same, and more particularly to a 3D stacked AND-type flash memory structure and methods of manufacturing and operating the same.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed.

However, the processes for manufacturing those three-dimensional NAND-type flash memory structures require several critical lithography steps for each memory layer, which is time-consuming and expansive. Although the benefits of higher density are achieved using 3D arrays, the expansive costs limit the staked layers of the 3D flash memory structures.

Also, the MOSFET (Metal-Oxide-Semiconductor Field-Effect Transistor) of the three-dimensional NAND-type flash memory structure are serially connected, and has significantly effects on the read latency.

It is desirable to develop a three-dimensional flash memory structure with larger number of multiple planes being stacked to achieve greater storage capacity, reliable and small memory elements that can be erased and programmed, improved read latency, a low manufacturing cost, and a manufacturing process easy to be carried out.

SUMMARY

The disclosure relates to a 3D stacked AND-type flash memory structure and method of manufacturing the same are provided. The related operation methods such as reading, programming and erasing the 3D stacked AND-type flash memory structure of the embodiment are also described herein. The 3D stacked AND-type structure with improved read latency is suitable for a one-bit per cell operation and a two-bit per cell operation.

According to one embodiment of the present disclosure, a 3D stacked AND-type flash memory structure is provided. The 3D AND-type structure comprises several horizontal planes of memory cells arranged in a three-dimensional array, and each horizontal plane comprising several word lines and several of charge trapping multilayers alternately arranged, and the adjacent word lines spaced apart from each other with each charge trapping multilayer interposed between; a plurality of sets of bit lines and source lines arranged alternately and disposed vertically to the horizontal planes; and a plurality of sets of channels and sets of insulation pillars arranged alternatively, and disposed perpendicularly to the horizontal planes, wherein one set of channels is sandwiched between the adjacent sets of bit lines and source lines.

According to one embodiment of the present disclosure, a method for manufacturing 3D stacked AND-type flash memory structure is provided. First, a substrate is provided. Then, a plurality of gate layers and insulation layers are deposited alternately on the substrate. The gate layers and insulation layers are patterned to form a plurality of WL stacks, and each WL stacks comprises alternating patterned gate layers as word lines and patterned insulation layers for isolating the word lines after patterning. Subsequently, a charge-trapping multilayer is formed on the WL stacks, lining the sidewalls of the WL stacks, and each trench is formed between the adjacent WL stacks lined with the charge-trapping multilayer. Next, a conductive layer is deposited on the WL stacks, and fills the trenches with the polysilicon. Then, the conductive layer is patterned to form a plurality of BL stacks, and the BL stacks are spaced apart alternately by a plurality of gaps. Subsequently, two doped regions are formed at two sides of each BL stack, and a channel is vertically sandwiched between the two doped regions, wherein the adjacent BL stacks are isolated from each other.

According to one embodiment of the present disclosure, a method for operating 3D stacked AND-type flash memory structure disclosed. First, a 3D stacked AND-type flash memory structure is provided, which comprises a plurality of horizontal planes of memory cells arranged in a three-dimensional array, a plurality of sets of bit lines and sets of source lines arranged alternately and disposed vertically to the horizontal planes, and a plurality of sets of channels and sets of insulation pillars arranged alternatively and disposed perpendicularly to the horizontal planes, wherein each horizontal plane comprises a plurality of word lines and a plurality of charge trapping multilayers alternately arranged, and the adjacent word lines are spaced apart from each other with each charge trapping multilayer interposed between, and one set of channels is sandwiched between the adjacent sets of bit lines and source lines. Then, a memory cell positioned at one of the horizontal planes is selected. An operating voltage is applied to each of two word lines adjacent to the selected memory cell at the horizontal plane to turn on the selected memory cell. At least one of two channels adjacent to the outsides of said two conducting word lines are turned off (ex: by applying a negative voltage). A relative voltage is applied to at least selected one of the sets of bit lines and sets of source lines, and other plural unselected sets of bit lines and unselected sets of source lines are applied with 0 voltages.

The disclosure will become apparent from the following detailed description of the preferred but non-limiting embodiments. The following description is made with reference to the accompanying drawings.

DETAILED DESCRIPTION

In the embodiment of the present disclosure, a 3D stacked AND-type flash memory structure and method of manufacturing the same are provided. Also, related operation methods such as reading, programming and erasing the 3D stacked AND-type flash memory structure of the embodiment are also described herein. The MOSFET (Metal-Oxide-Semiconductor Field-Effect Transistor) of the 3D stacked AND-type flash memory structure are connected in parallel instead of serially connected in the NAND-type flash memory structure; thus, the read latency can be greatly enhanced. Also, the 3D stacked AND-type flash memory structure of the embodiment can be programmed by channel hot electron programming (CHE) method like NOR Flash, or programmed by FN (Fowler-Nordheim) tunneling method like NAND Flash. In the embodiment of the present disclosure, the device is a double-gated charge-trapping device, and the double gates could be independently decoded, so that physically two bit/cell operation can be carried out.

The embodiments disclosed below are for elaborating the 3D stacked AND-type flash memory structure of the disclosure. However, the descriptions disclosed in the embodiments of the disclosure such as detailed structure, manufacturing procedures and material selections are for illustration only, not for limiting the scope of protection of the disclosure.

3D Stacked AND-Type Flash Memory Structure

Figure 1:
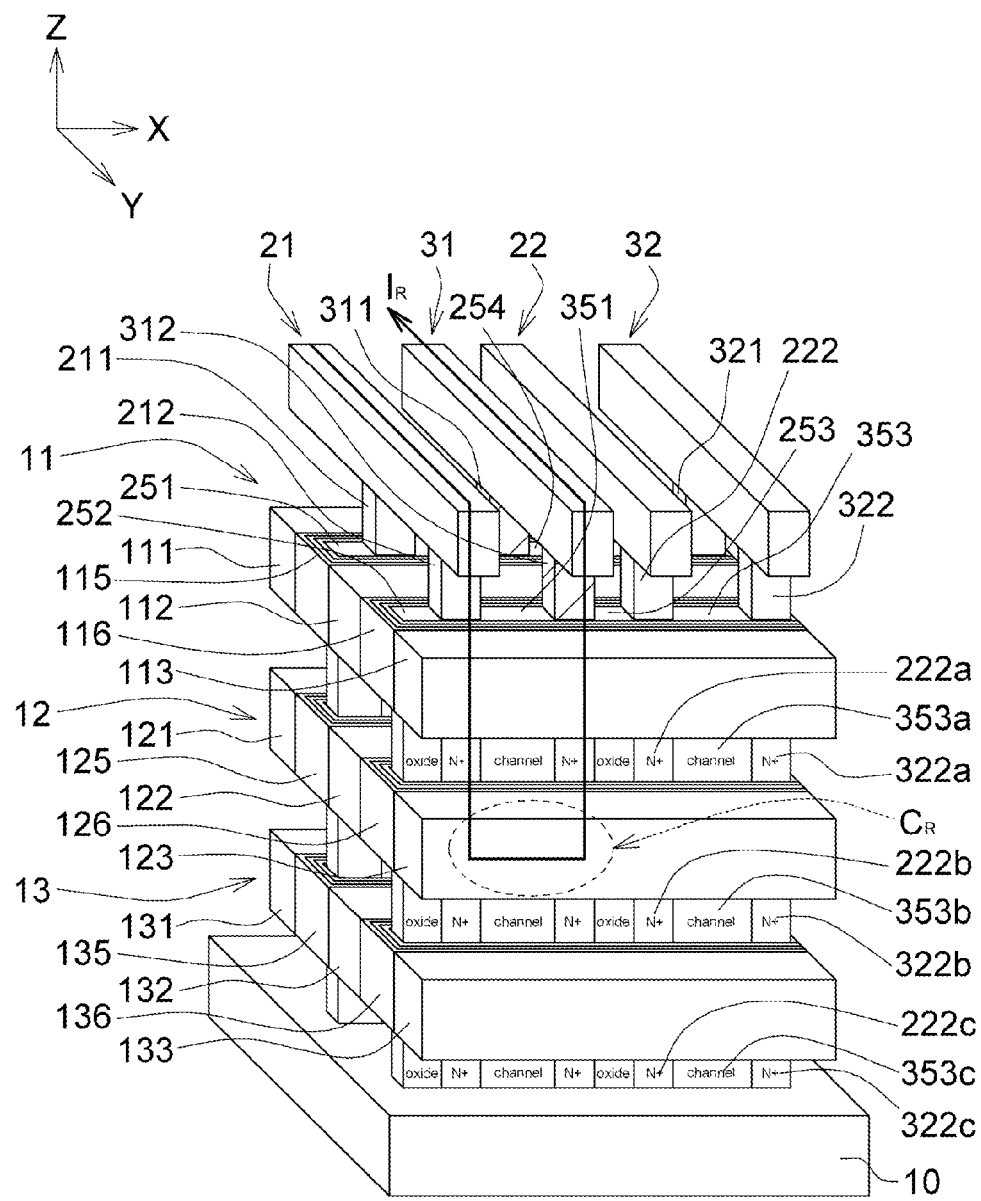
FIG. 1 shows a portion of a 3D stacked AND-type flash memory structure according to the embodiment of the present disclosure.

FIG. 1 shows a portion of a 3D stacked AND-type flash memory structure according to the embodiment of the present disclosure. The 3D stacked AND-type flash memory structure comprises a plurality of horizontal planes of memory cells, constructed on a substrate 10 with a buried oxide formed thereon. In FIG. 1, three horizontal planes of memory cells 11, 12 and 13 lie in X-Y plane are illustrated. Each horizontal plane includes plural word lines and charge trapping multilayers (such as ONO, ONONO or BE-SONOS multilayers, and the structure of BE-SONOS could be referred to U.S. Pat. No. 7,414,889, application Ser. No. 11/419,977) alternately arranged in parallel. The adjacent word lines of each horizontal plane are spaced apart from each other with a charge trapping multilayer interposed between. As shown in FIG. 1, the horizontal plane 11 includes the word lines 111, 112 and 113, and the charge trapping multilayers 115 and 116 alternately arranged in parallel, wherein the adjacent word lines 111 and 112 of the horizontal plane 11 are spaced apart from each other with a charge trapping multilayer 115 interposed between. The adjacent word lines 112 and 113 of the horizontal plane 11 are spaced apart from each other with a charge trapping multilayer 116 interposed between.

Similarly, the horizontal plane 12 includes the word lines 121, 122 and 123, and the charge trapping multilayers 125 and 126 alternately arranged in parallel, wherein the adjacent word lines 121 and 122 of the horizontal plane 12 are spaced apart from each other with a charge trapping multilayer 125 interposed between. The adjacent word lines 122 and 123 of the horizontal plane 12 are spaced apart from each other with a charge trapping multilayer 126 interposed between.

Similarly, the horizontal plane 13 includes the word lines 131, 132 and 133, and the charge trapping multilayers 135 and 136 alternately arranged in parallel, wherein the adjacent word lines 131 and 13 of the horizontal plane 13 are spaced apart from each other with a charge trapping multilayer 135 interposed between. The adjacent word lines 132 and 133 of the horizontal plane 13 are spaced apart from each other with a charge trapping multilayer 136 interposed between.

Also, the 3D stacked AND-type flash memory structure of the embodiment of the present disclosure comprises an array of several sets of bit lines and sets of source lines arranged alternately and disposed vertically for penetrating the horizontal planes. The adjacent sets of bit lines and source lines are spaced apart and independent from each other. As shown in FIG. 1, two sets of bit lines 21 and 22 and two sets of source lines 31 and 22, which are spaced apart and independent from each other, are illustrated. The set of bit lines 21 includes several bit line pillars such as the bit line pillars 211 and 212 disposed vertically to the horizontal planes 11-13, while the set of bit lines 22 includes two bit line pillars (222 shown due to the viewing angle) disposed vertically to the horizontal planes 11-13. Similarly, the set of source lines 31 includes the source line pillars 311 and 312, and the set of source lines 32 includes the source line pillars 321 and 322, wherein the source line pillars 311, 312, 321 and 322 are disposed vertically to the horizontal planes 11-13.

Also, the bit lines pillars and the source line pillars are arranged perpendicularly to the word lines and the charge trapping multilayers of each horizontal plane. As shown in FIG. 1, the bit lines pillars 211 and 212, 222 are disposed perpendicularly to the word lines 111-113 and the charge trapping multilayers 115-116 of the horizontal plane 11, and also disposed perpendicularly to the word lines 121-123 and the charge trapping multilayers 125-126 of the next horizontal plane 12, and also disposed perpendicularly to the word lines 131-133 and the charge trapping multilayers 135-136 of the next horizontal plane 13.

Further, a plurality of sets of insulation pillars (such as oxide pillars) and sets of channels are disposed perpendicularly to the horizontal planes and arranged alternatively, wherein one set of channels is sandwiched between the adjacent sets of bit lines and source lines for the memory cells. In FIG. 1, the sets of insulation pillars and sets of channels extend down along the Z-direction. As shown in FIG. 1, the sets of insulation pillars 251, 252, 253, 254 and the sets of channels 351, 353 are arranged alternatively and disposed perpendicularly to the horizontal planes 11-13. The set of channels 351 is sandwiched between the adjacent set of bit lines 21 and set of source lines 31, while the set of channels 353 is sandwiched between the adjacent set of bit lines 22 and set of source lines 32. The set of insulation pillars 253 is sandwiched between the adjacent set of source lines 31 and set of bit lines 22. Also, the set of bit lines 22 is disposed between the adjacent set of insulation pillars 253 and the set of channels 353.

Also, in the embodiment, each set of bit lines at least comprises buried bit line portions between the adjacent horizontal planes, and each set of source lines comprises buried source line portions between the adjacent horizontal planes. For example, the bit line pillar 222 of the set of bit lines 22 comprises a buried bit line portion 222a between the adjacent horizontal planes 11 and 12, and a buried bit line portion 222b between the adjacent horizontal planes 12 and 13, and a buried bit line portion 222c between the horizontal plane 13 and the substrate 10 with buried oxide, as shown in FIG. 1. The source line pillar 322 of the set of source lines 32 comprises a buried source line portion 322a between the adjacent horizontal planes 11 and 12, and a buried source line portion 322b between the adjacent horizontal planes 12 and 13, and a buried source line portion 322c between the horizontal plane 13 and the substrate 10 with buried oxide, as shown in FIG. 1. Also, in the embodiment, each set of channels comprises a plurality of vertical channel regions, and each channel region is sandwiched between the adjacent buried bit line portion and buried source line portion. As shown in FIG. 1, the channel 353 comprises the vertical channel regions 353a, 353b and 353c, wherein the channel region 353a is sandwiched between the adjacent buried bit line portion 222a and buried source line portion 322a, the channel region 353b is sandwiched between the adjacent buried bit line portion 222b and buried source line portion 322b, and the channel region 353c is sandwiched between the adjacent buried bit line portion 222c and buried source line portion 322c.

Furthermore, the charge trapping multilayers of each horizontal plane surround the insulation pillars, the sets of bit lines and source lines, and the channels. Also, the charge trapping multilayers for each horizontal plane could be view as on the contact of the opposing sides of the adjacent word lines. For example, the charge trapping multilayer 115 of the horizontal plane 11 surround the insulation pillars 251, 254, the sets of bit lines 21 and 22, the sets of source lines 31 and 32, and the channels 351, 353. The charge trapping multilayer 115 of the horizontal plane 11 are also could be referred as being on the contact of the opposing sides of the adjacent word lines 111 and 112.

In the embodiment, the word lines and the sets of channels could comprises material of polysilicon, and the sets of bit lines and source lines could comprise material of n+ doped polysilicon. Other materials are also not limited in the practical application.

Methods for Operating the 3D Stacked AND-Type Flash Memory Structure

The 3D stacked AND-type flash memory structure as presented in the embodiment of the disclosure could be programmed by channel hot electron (CHE) programming method, or programmed by +FN (Fowler-Nordheim) tunneling method. The 3D stacked AND-type flash memory structure could be erased by −FN tunneling method. Those operating methods are demonstrated below.

Reading

Figure 2A:
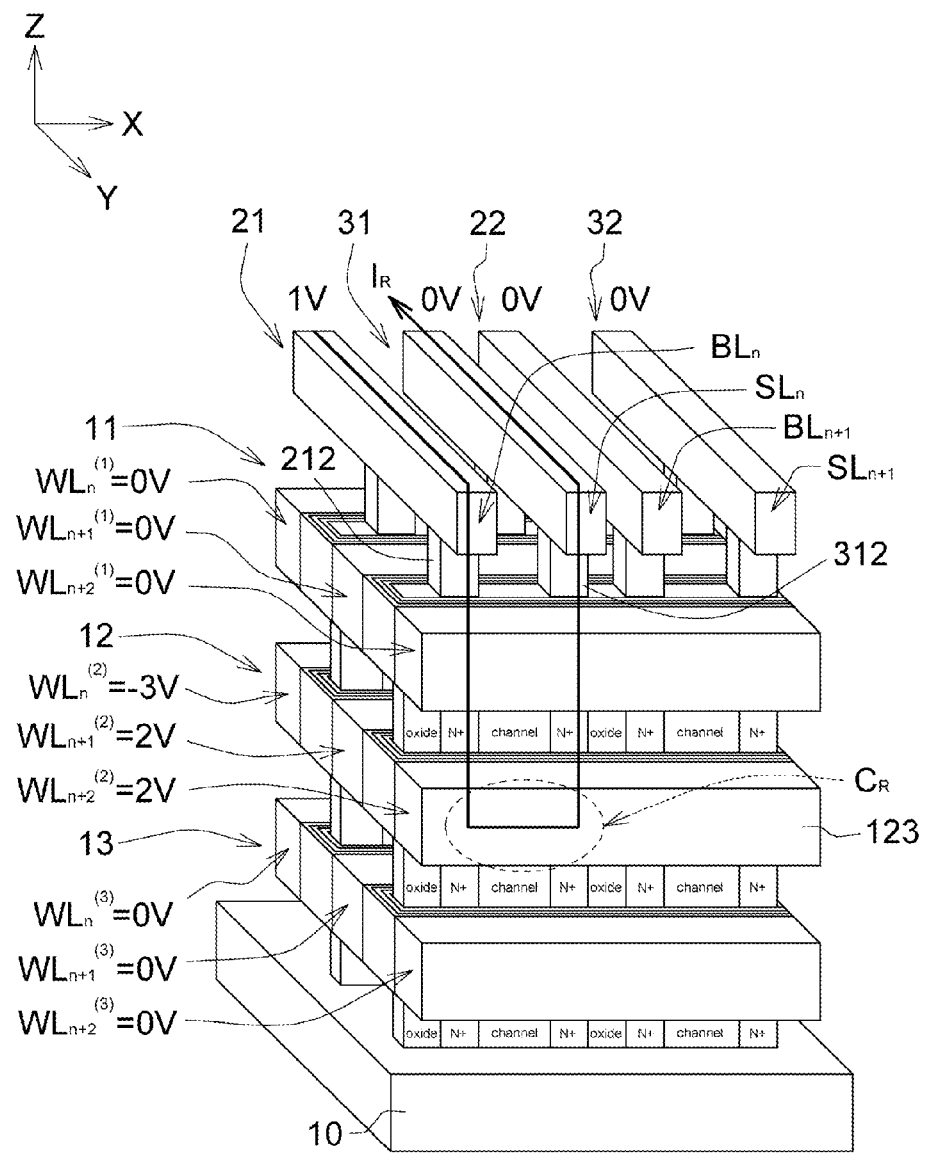
FIG. 2A illustrates a 3D stacked AND-type flash memory structure and a cell thereof to be read according to the embodiment of the disclosure.
Figure 2B:
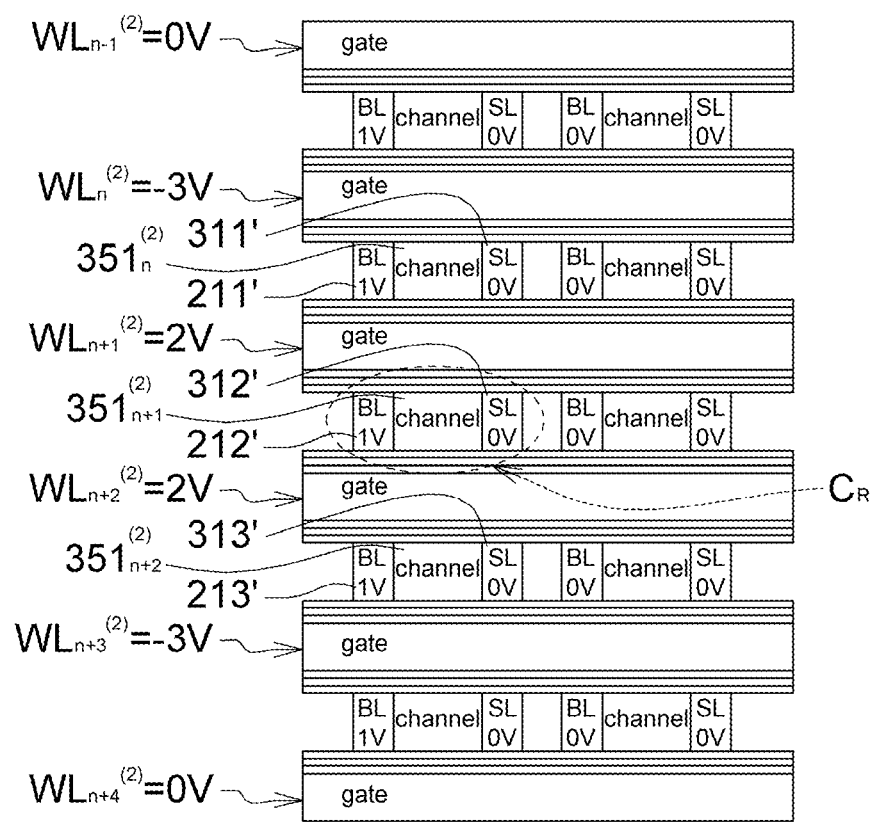
FIG. 2B shows more word lines of the second plane 12 than FIG. 2A for the purpose of the clarity of description.

FIG. 2A illustrates a 3D stacked AND-type flash memory structure and a cell thereof to be read according to the embodiment of the disclosure. The dotted circle encloses the cell $C_R$ to be read at the second horizontal plane 12. The U-shaped line $I_R$ represents a reading current flow which passes through the bit line pillar 212 to the word line $WL_{n+2}^{(2)}$ at the second horizontal plane 12 and to the source line pillar 312. Each channel is controlled by two nearby word lines. FIG. 2B is a top view of the second plane of the 3D stacked AND-type flash memory structure of FIG. 2A. FIG. 2B shows more word lines of the second plane 12 than FIG. 2A for the purpose of the clarity of description. Some of the reference numerals used in FIG. 1 are repeated in FIG. 2A~FIG. 2B where appropriate. FIG. 2A and FIG. 2B also show representative operating voltages applied on the related and adjacent word lines, bit lines and source lines of the 3D structure. Of course the voltage levels will be adjusted as suits a particular implementation and programming or erasing methods.

Please referred to FIG. 2A and FIG. 2B. As shown in FIG. 2A and FIG. 2B, the cell $C_R$ to be read is at the second horizontal plane 12. During reading the cell $C_R$, the two word lines $WL_{n+1}^{(2)}$ and $WL_{n+2}^{(2)}$ are turned on (such as 2V or Vref, which is in between the erased and programmed-state voltages Vt) to read the selected cell $C_R$. On the other hand, other unselected word lines are applied with 0V (or below erased voltage Vt) to turn-off the cells.

Further, channel is turned-off by the adjacent negative word lines bias. In the embodiment, it is noted that two adjacent word lines are applied with a negative voltage (such as −3V) to guarantee the adjacent channel (i.e. next to the channel of the to-be-read cell) is completely turned-off. As shown in FIG. 2B, the channel $351_{n+1}^{(2)}$ of the to-be-read cell $C_R$ is disposed between the bit line portion 212' and the source line portion 312'; the adjacent channel $351_n^{(2)}$ next to the channel $351_{n+1}^{(2)}$ of the to-be-read cell $C_R$ is disposed between the bit line portion 211' and the source line portion 311'; and the other adjacent channel $351_{n+2}^{(2)}$ (next to the channel $351_{n+1}^{(2)}$ of the to-be-read cell $C_R$ is disposed between the bit line portion 213' and the source line portion 313'. During reading the cell $C_R$, two adjacent word lines $WL_n^{(2)}$ and $WL_{n+3}^{(2)}$ are applied with a negative voltage (such as −3V) to guarantee the adjacent channels $351_n^{(2)}$ and $351_{n+2}^{(2)}$ (next to the channel $351_{n+1}^{(2)}$ of the to-be-read cell $C_R$) is completely turned-off.

Also, 1V, 0V, 0V and 0V of voltages are applied to the selected set of bit lines 21, unselected set of bit lines 22, the sets of source lines 31 and 32, respectively. The word lines at the first and third horizontal planes 11 and 13 are also applied with 0V.

Channel Hot Electron Programming Method

Figure 3A:
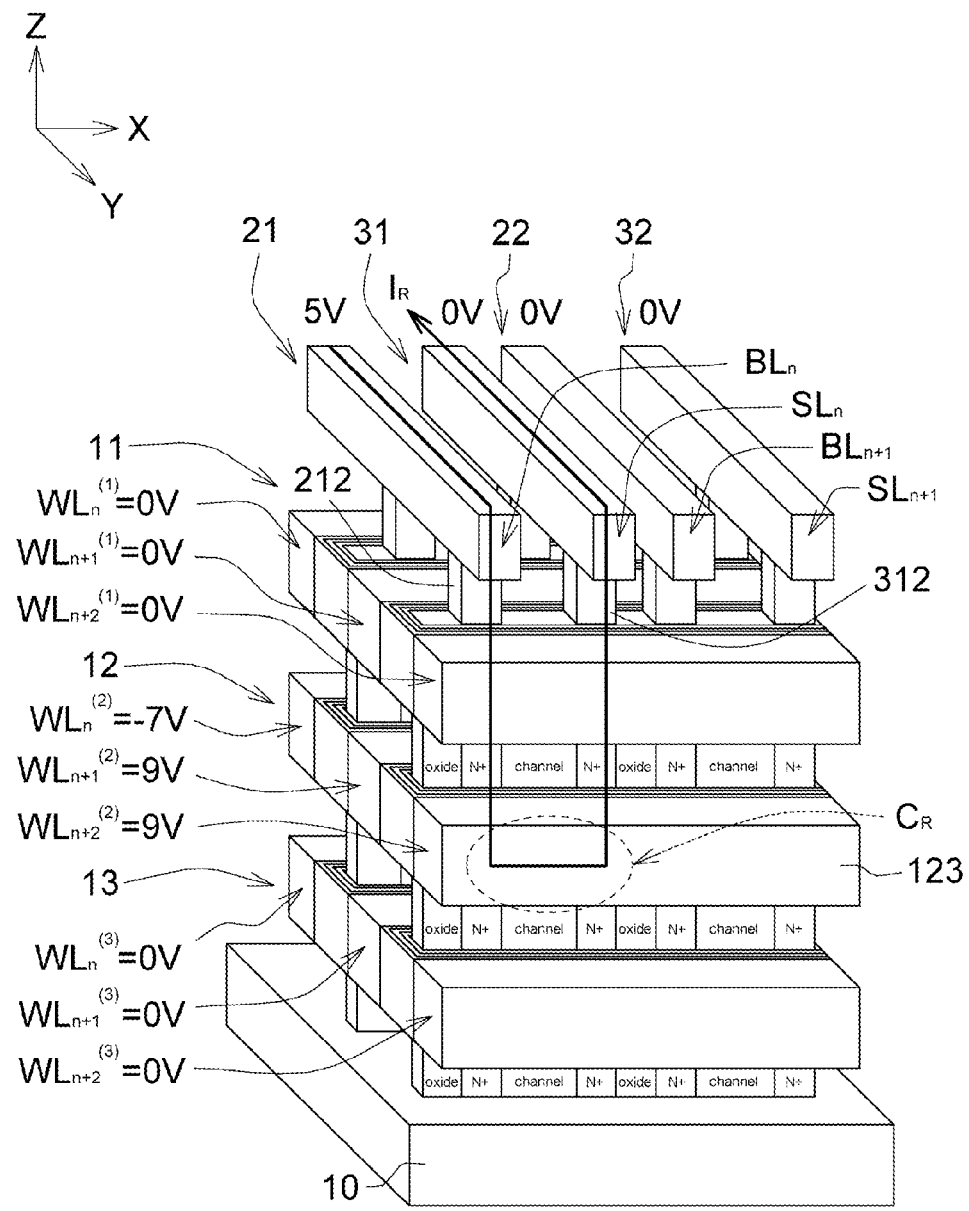
FIG. 3A illustrates a cell of a 3D stacked AND-type flash memory structure according to the embodiment of the disclosure being programmed by channel hot electron (CHE) programming method.
Figure 3B:
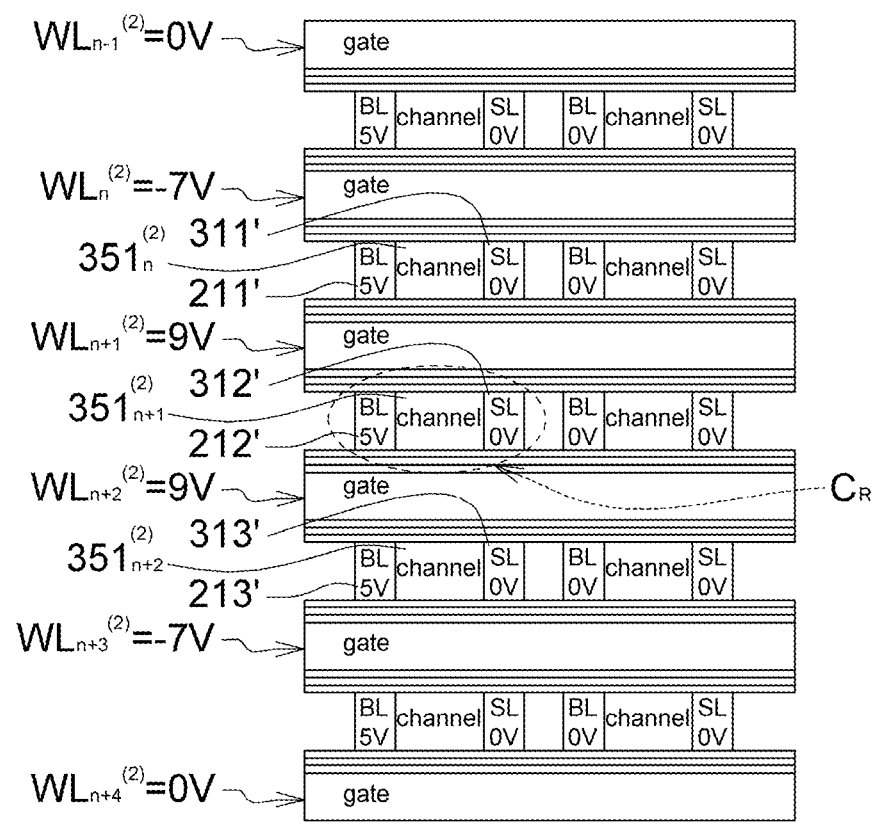
FIG. 3B is a top view of the second plane of the 3D stacked AND-type flash memory structure of FIG. 3A.

FIG. 3A illustrates a cell of a 3D stacked AND-type flash memory structure according to the embodiment of the disclosure being programmed by channel hot electron (CHE) programming method. Similarly, the dotted circle encloses the cell $C_R$ to be read at the second horizontal plane 12, and each channel is controlled by two nearby word lines. FIG. 3B is a top view of the second plane of the 3D stacked AND-type flash memory structure of FIG. 3A. Some of the reference numerals used in FIG. 1 and FIG. 2A~FIG. 2B are repeated in FIG. 3A~FIG. 3B where appropriate. FIG. 3A and FIG. 3B also show representative operating voltages applied on the related and adjacent word lines, bit lines and source lines of the 3D structure. It is of course known in the art that the voltage levels could be adjusted as suits a particular implementation for CHE programming method.

Please referred to FIG. 3A and FIG. 3B. During programming the cell $C_R$, the two word lines $WL_{n+1}^{(2)}$ and $WL_{n+2}^{(2)}$ are highly turned on, such as by applying voltages of +9V, to induce a high vertical field to attract electrons (e⁻). Selected bit lines (the set of bit lines 21) are applied with about +5V to induce channel hot electrons at the selected cell $C_R$.

On the other hand, other unselected word lines are applied with 0V (or below erased voltage Vt) to turn-off the cells. Also, 0V, 0V and 0V of voltages are applied to the unselected set of bit lines 22, the sets of source lines 31 and 32, respectively. The word lines at the first and third horizontal planes 11 and 13 are also applied with 0V.

Furthermore, channel is turned-off by the adjacent negative word lines bias. In the embodiment, it is noted that two adjacent word lines are applied with a negative voltage (such as −7V) to guarantee the adjacent channel (i.e. next to the channel of the to-be-programmed cell) is completely turned-off. As shown in FIG. 3B, the channel $351_{n+1}^{(2)}$ of the to-be-programmed cell $C_R$ is disposed between the bit line portion 212' and the source line portion 312'; the adjacent channel $351_n^{(2)}$ next to the channel $351_{n+1}^{(2)}$ of the to-be-programmed cell $C_R$ is disposed between the bit line portion 211' and the source line portion 311'; and the other adjacent channel $351_{n+2}^{(2)}$ next to the channel $351_{n+1}^{(2)}$ of the to-be-programmed cell $C_R$ is disposed between the bit line portion 213' and the source line portion 313'. During CHE programming the cell $C_R$, two adjacent word lines $WL_n^{(2)}$ and $WL_{n+3}^{(2)}$ are applied with a negative voltage (such as −7V) to completely turn off the adjacent channels $351_n^{(2)}$ and $351_{n+2}^{(2)}$ (next to the channel $351_{n+1}^{(2)}$ of the to-be-programmed cell $C_R$).

FN Programming Method

Figure 4A:
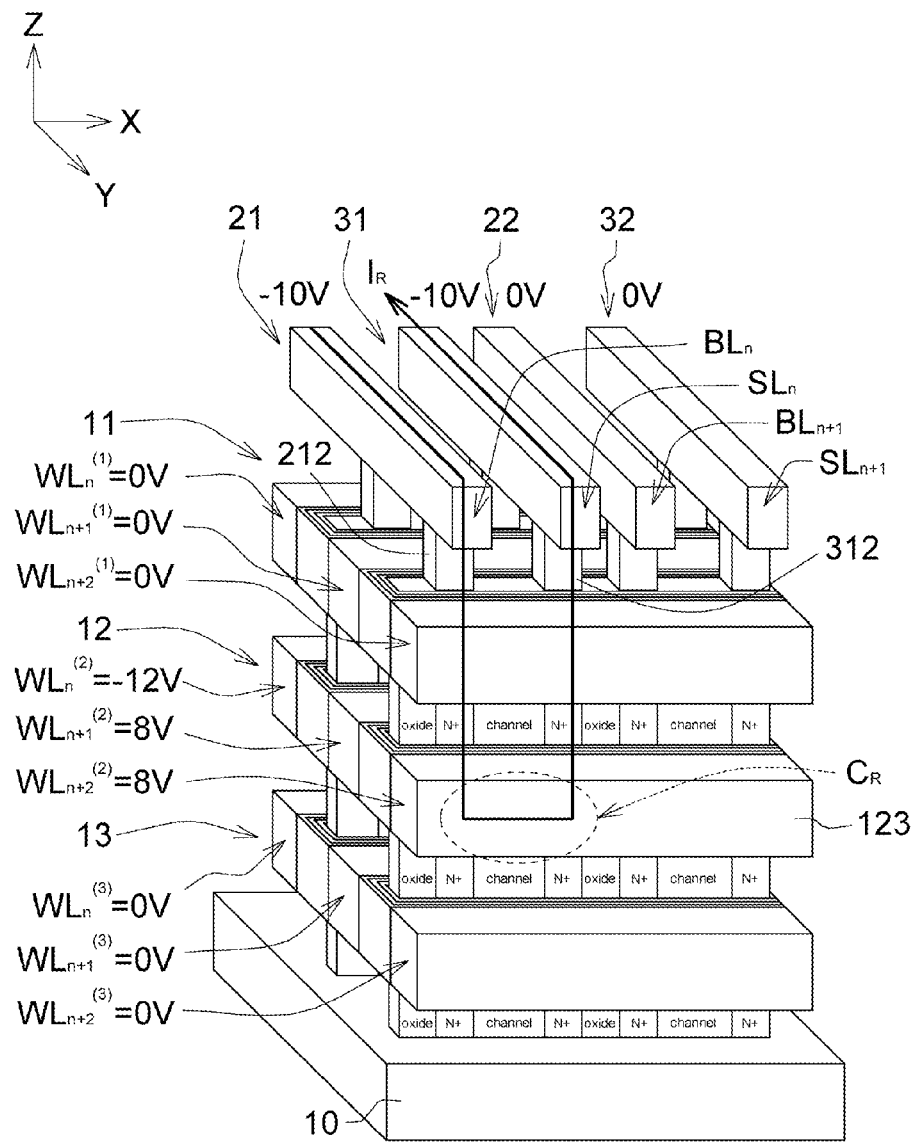
FIG. 4A illustrates a cell of a 3D stacked AND-type flash memory structure according to the embodiment of the disclosure being programmed by Fowler-Nordheim (FN) programming method.
Figure 4B:
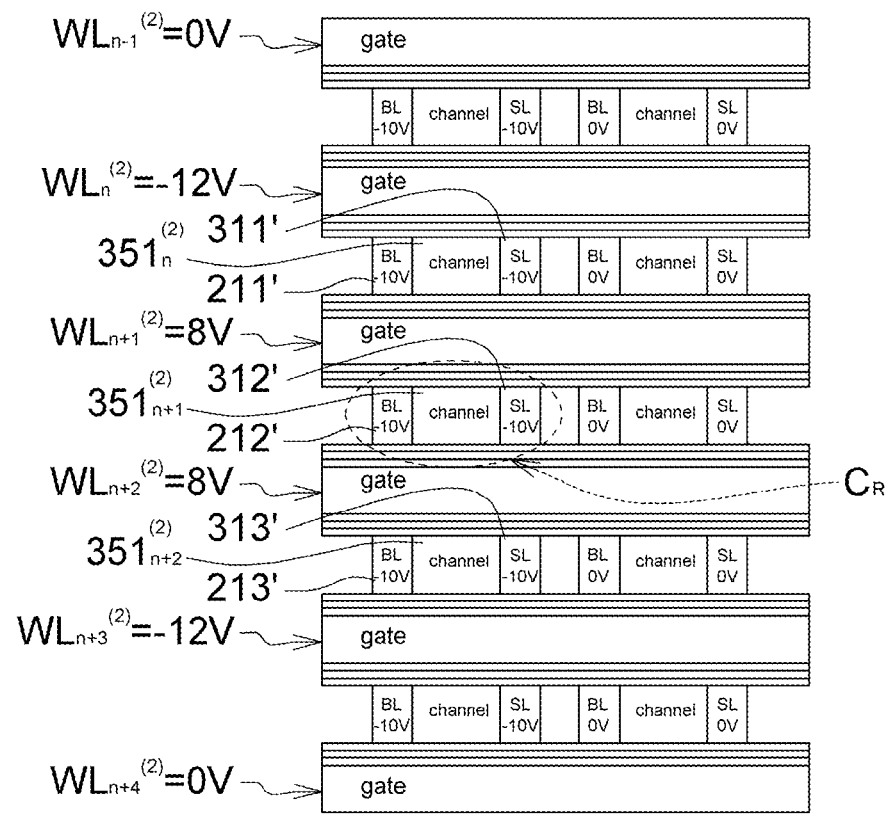
FIG. 4B is a top view of the second plane of the 3D stacked AND-type flash memory structure of FIG. 4A.

FIG. 4A illustrates a cell of a 3D stacked AND-type flash memory structure according to the embodiment of the disclosure being programmed by Fowler-Nordheim (FN) programming method. Similarly, the dotted circle encloses the cell $C_R$ to be read at the second horizontal plane 12, and each channel is controlled by two nearby word lines. FIG. 4B is a top view of the second plane of the 3D stacked AND-type flash memory structure of FIG. 4A. Some of the reference numerals used in FIG. 1 and FIG. 2A~FIG. 2B are repeated in FIG. 4A~FIG. 4B where appropriate. FIG. 4A and FIG. 4B also show representative operating voltages applied on the related and adjacent word lines, bit lines and source lines of the 3D structure. It is of course known in the art that the voltage levels could be adjusted as suits a particular implementation for FN programming method.

Please referred to FIG. 4A and FIG. 4B. During FN programming the cell $C_R$, the two word lines $WL_{n+1}^{(2)}$ and $WL_{n+2}^{(2)}$ are highly turned on, such as by applying voltages of +8V, to induce a high vertical field to attract electrons (e⁻). Selected bit lines (i.e, the set of bit lines 21) as well as source lines (i.e, the set of source lines 31) are applied with a high negative voltage of about −10V. The selected cell $C_R$ will have effective voltage of ~18V (=8−(−10)) for the FN tunneling.

Other unselected word lines are applied with 0V (or below erased voltage Vt) to turn-off the cells. Also, 0V and 0V of voltages are applied to the unselected set of bit lines 22 and the set of source lines 32, respectively. The word lines at the first and third horizontal planes 11 and 13 are also applied with 0V.

Furthermore, channel is turned-off by the adjacent negative word lines bias. In the embodiment, it is noted that two adjacent word lines are applied with a negative voltage (such as −12V) to guarantee the adjacent channels (i.e. next to the channel of the to-be-read cell) are completely turned-off. As shown in FIG. 4B, the channel $351_{n+1}^{(2)}$ of the to-be-programmed cell $C_R$ is disposed between the bit line portion 212' and the source line portion 312'; the adjacent channel $351_n^{(2)}$ next to the channel $351_{n+1}^{(2)}$ of the to-be-programmed cell $C_R$ is disposed between the bit line portion 211' and the source line portion 311'; and the other adjacent channel $351_{n+2}^{(2)}$ next to the channel $351_{n+1}^{(2)}$ of the to-be-programmed cell $C_R$ is disposed between the bit line portion 213' and the source line portion 313'. During FN programming the cell $C_R$, two adjacent word lines $WL_n^{(2)}$ and $WL_{n+3}^{(2)}$ are applied with a negative voltage (such as −12V) to completely turn off the adjacent channels $351_n^{(2)}$ and $351_{n+2}^{(2)}$ (next to the channel $351_{n+1}^{(2)}$ of the to-be-programmed cell $C_R$).

FN Erasing Method

Figure 5A:
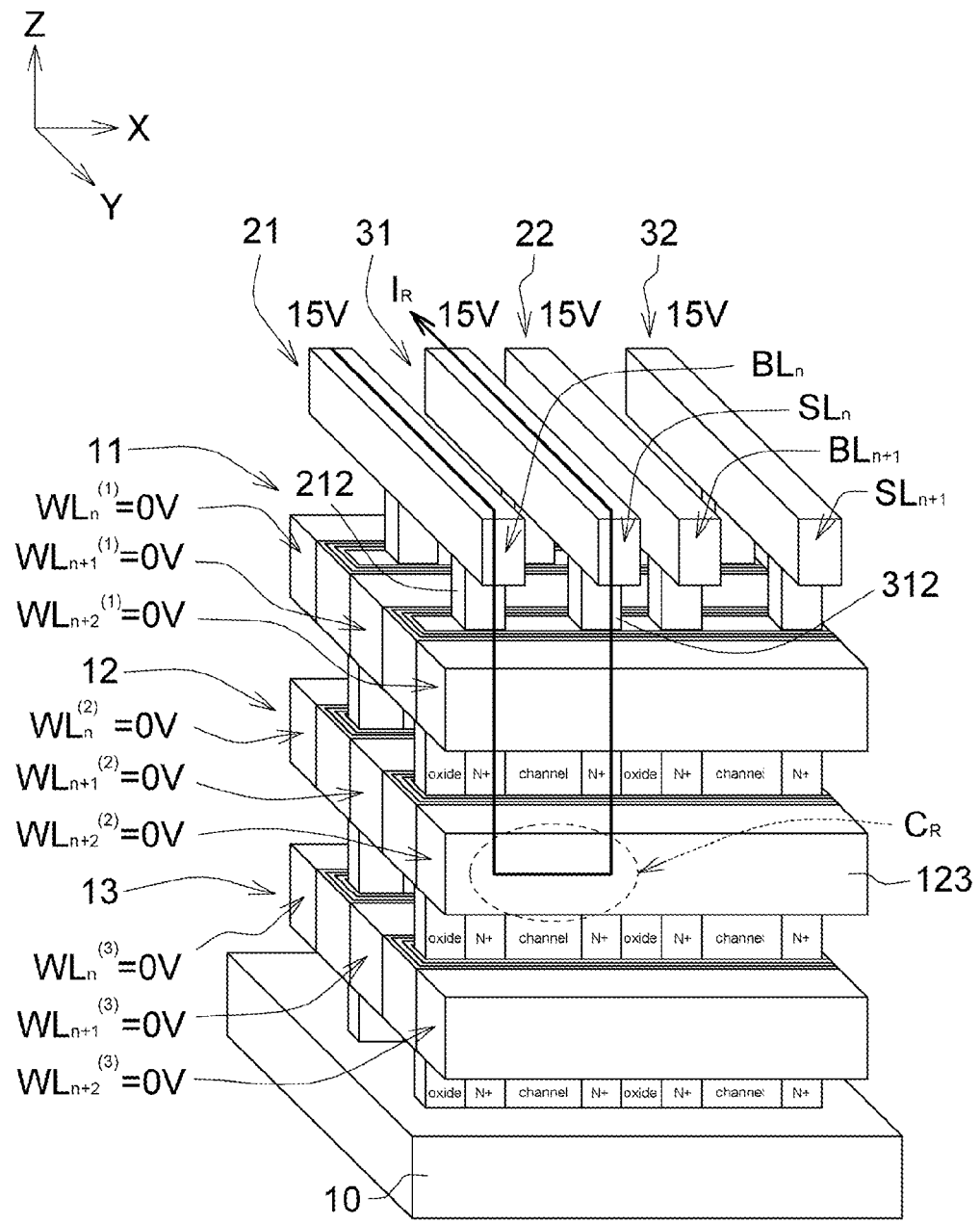
FIG. 5A illustrates a 3D stacked AND-type flash memory structure according to the embodiment of the disclosure being block erasing by FN erasing method.
Figure 5B:
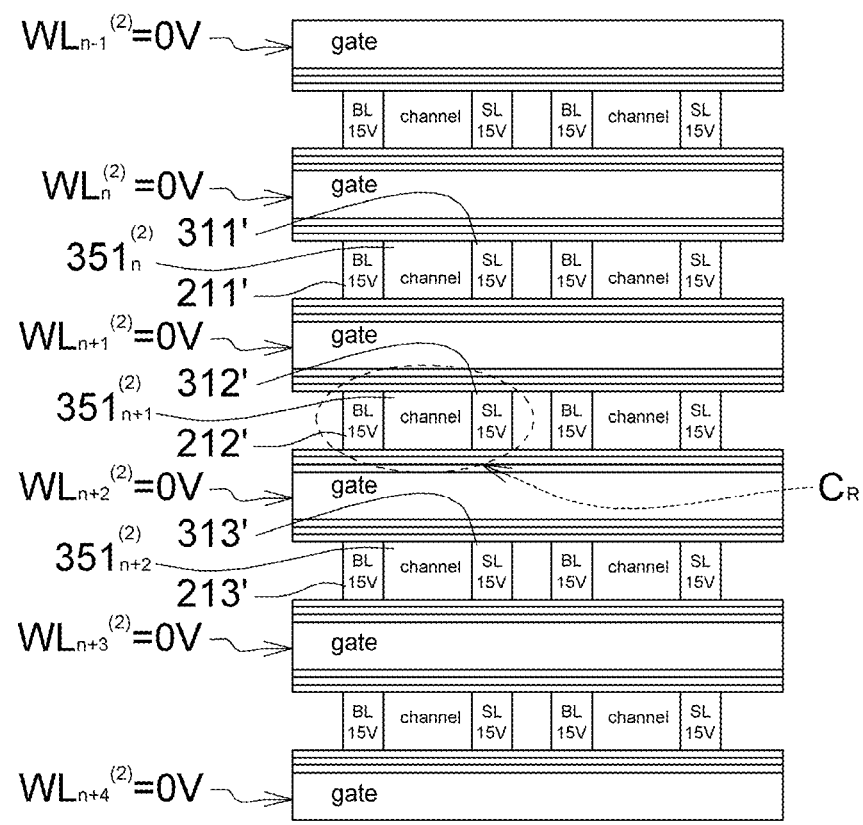
FIG. 5B is a top view of the second plane of the 3D stacked AND-type flash memory structure of FIG. 5A.

FIG. 5A illustrates a 3D stacked AND-type flash memory structure according to the embodiment of the disclosure being block erasing by FN erasing method. FIG. 5B is a top view of the second plane of the 3D stacked AND-type flash memory structure of FIG. 5A. Some of the reference numerals used in FIG. 1 and FIG. 2A~FIG. 2B are repeated in FIG. 5A~FIG. 5B where appropriate. FIG. 5A and FIG. 5B also show representative operating voltages applied on the related and adjacent word lines, bit lines and source lines of the 3D structure. It is of course known in the art that the voltage levels could be adjusted as suits a particular implementation for FN erasing method.

Please referred to FIG. 5A and FIG. 5B. During FN erasing, a high positive voltage such as +15V is applied to all of the bit lines (such as the set of bit lines 21 and 22) and source lines (such as the set of bit lines 31 and 32). The word lines of the selected blocks are all applied with 0V, as shown in FIG. 5A and FIG. 5B. The word lines of the unselected blocks have the same bias of +15V for erase inhibit.

Reading by Two Bits Per Cell (2 bits/cell) Operation

In the embodiment of the present disclosure, the 3D stacked AND-type flash memory structure is a double-gated charge-trapping (typically BE-SONOS) device, and the double gates could be independently decoded, so that physically two bit/cell operation can be carried out.

Figure 6A:
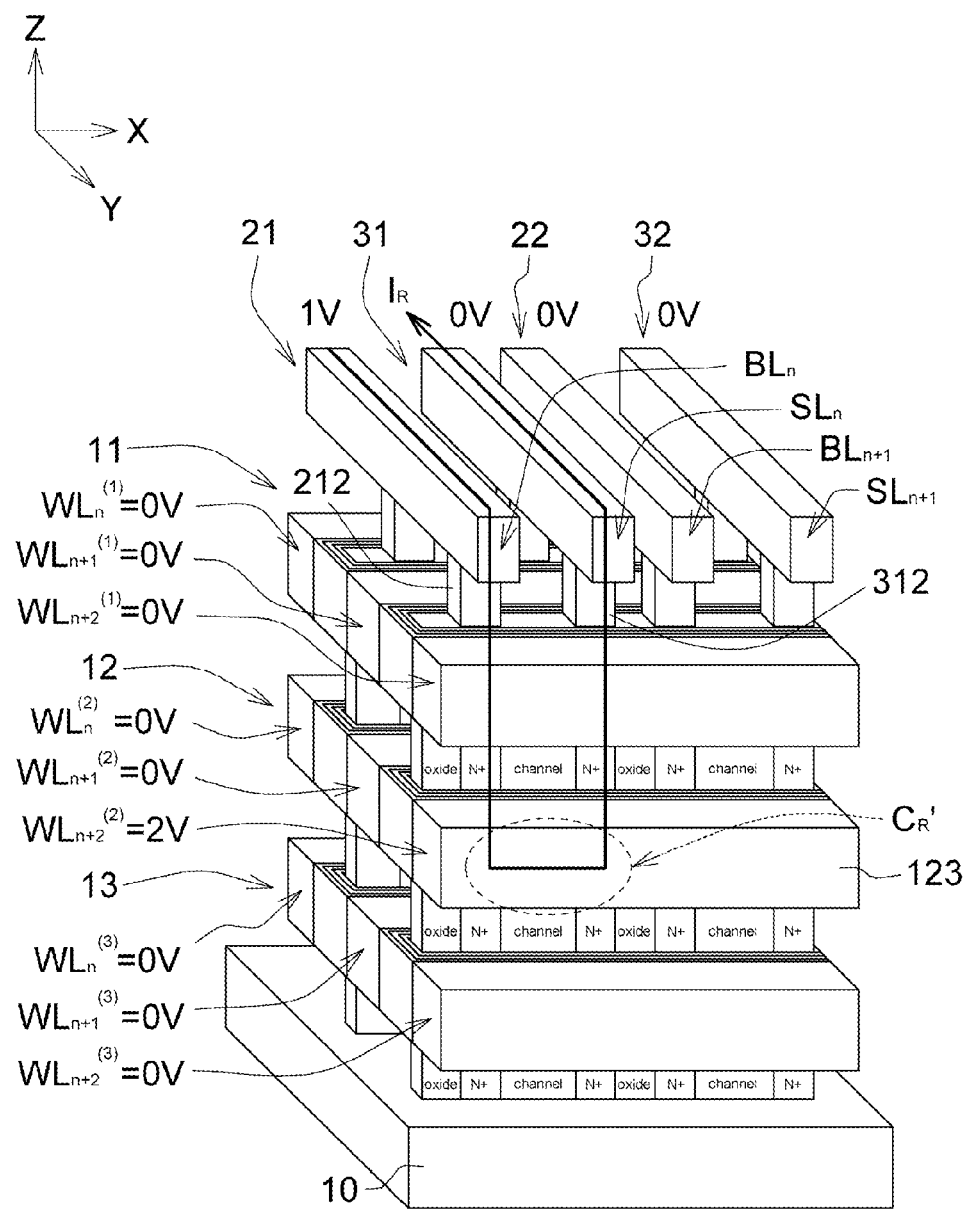
FIG. 6A illustrates a cell of a 3D stacked AND-type flash memory structure according to the embodiment of the disclosure, capable of being operated as two bits per cell.
Figure 6B:
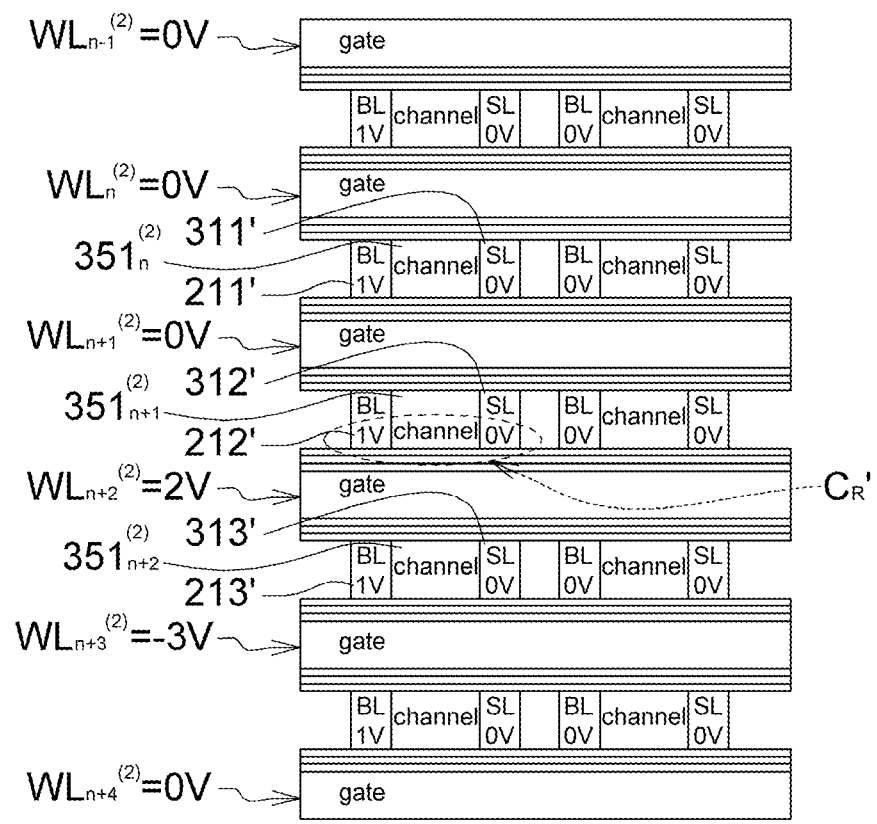
FIG. 6B is a top view of the second plane of the 3D stacked AND-type flash memory structure of FIG. 6A, and the cell is operated by one-side reading.

FIG. 6A illustrates a cell of a 3D stacked AND-type flash memory structure according to the embodiment of the disclosure, capable of being operated as two bits per cell. FIG. 6B is a top view of the second plane of the 3D stacked AND-type flash memory structure of FIG. 6A, and the cell is operated by one-side reading. Similarly, the dotted circle encloses the cell $C_R'$ to be read at the second horizontal plane 12, and each channel is controlled by two nearby word lines. Some of the reference numerals used in FIG. 1 and FIG. 2A~FIG. 2B are repeated in FIG. 6A~FIG. 6B where appropriate.

FIG. 6A and FIG. 6B also show representative operating voltages applied on the related and adjacent word lines, bit lines and source lines of the 3D structure when one-side reading is performed. It is of course known in the art that the voltage levels could be adjusted as suits a particular implementation for one-side reading.

Please referred to FIG. 6A and FIG. 6B. The channel $351_{n+1}^{(2)}$ of the to-be-read cell $C_R'$ is disposed between the bit line portion 212' and the source line portion 312'; the adjacent channel $351_n^{(2)}$ next to the channel $351_{n+1}^{(2)}$ of the to-be-read cell $C_R'$ is disposed between the bit line portion 211' and the source line portion 311'; and the other adjacent channel $351_{n+2}^{(2)}$ next to the channel $351_{n+1}^{(2)}$ of the to-be-read cell $C_R'$ is disposed between the bit line portion 213' and the source line portion 313'.

When one-side reading of the selected cell $C_R'$ is performed (as enclosed by the region of FIG. 6B), only one word line $WL_{n+2}{}^{(2)}$ closest to the reading region is biased at Vref such as 2V, while the word line $WL_{n+1}{}^{(2)}$ is applied with 0V.

Also, selected bit lines (i.e, the set of bit lines 21) are applied with 1V, and unselected set of bit lines 22 and the sets of source lines 31 and 32 are applied with 0V. Other unselected word lines at the second horizontal plane 12 (such as $WL_{n-1}{}^{(2)}$, $WL_n{}^{(2)}$, $WL_{n+1}{}^{(2)}$, $WL_{n+4}{}^{(2)}$), and the word lines at the first and third horizontal planes 11 and 13, are applied with 0V (or below erased voltage Vt) to turn-off the cells.

Furthermore, to avoid the adjacent channel turned-on, a negative voltage is applied to suppress the channel. In the embodiment, it is noted that one adjacent word line are applied with a negative voltage to suppress or completely turn-off the adjacent channel (i.e. next to the channel $351_{n+1}{}^{(2)}$ of the to-be-read cell). For example, the channel $351_{n+2}{}^{(2)}$ is turned-off by applying a negative voltage such as −3V to the adjacent word line $WL_{n+3}{}^{(2)}$.

CHE Programming by Two Bits Per Cell (2 Bits/Cell) Operation

Figure 7A:
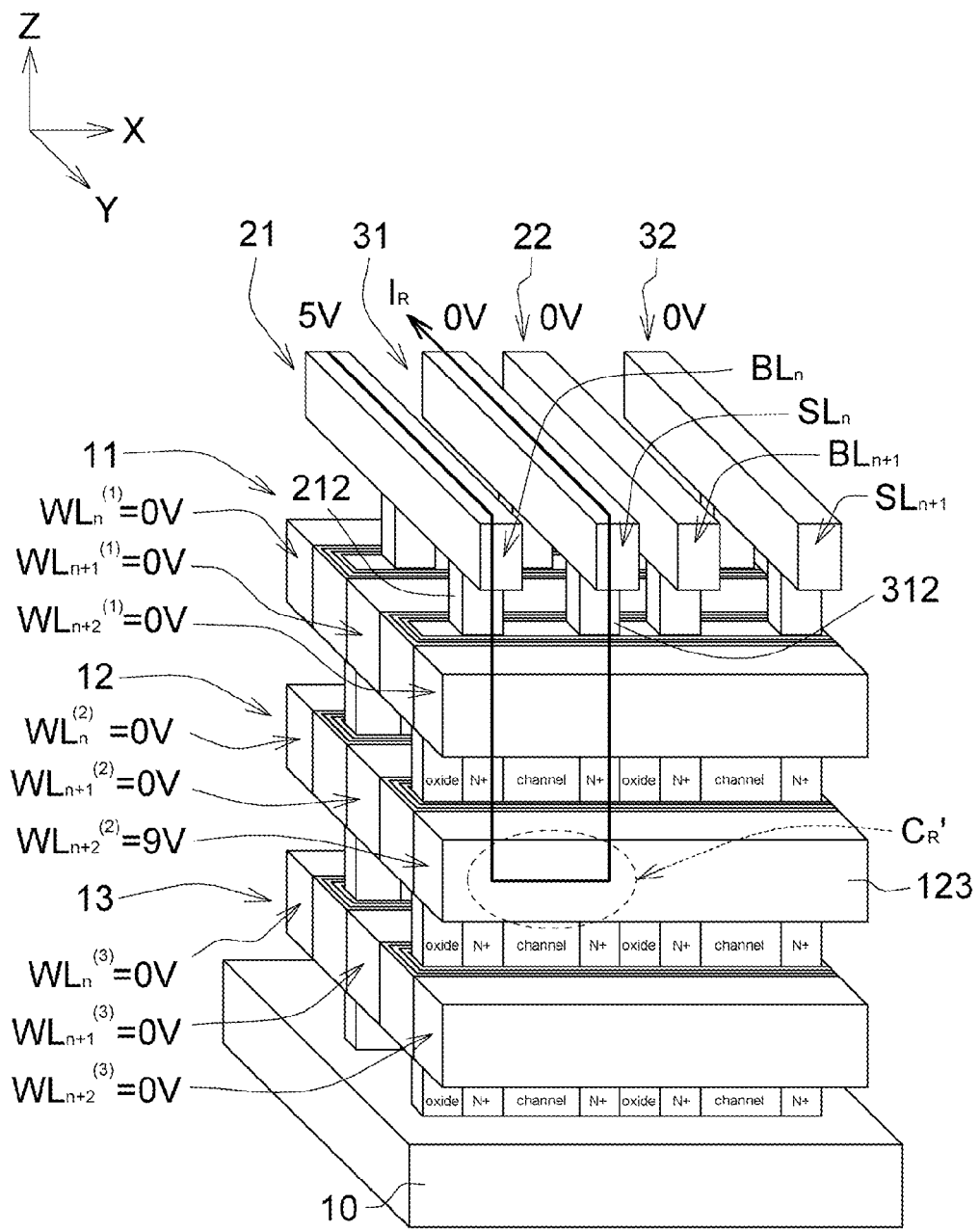
FIG. 7A illustrates a cell of a 3D stacked AND-type flash memory structure according to the embodiment of the disclosure, capable of being operated as two bits per cell.
Figure 7B:
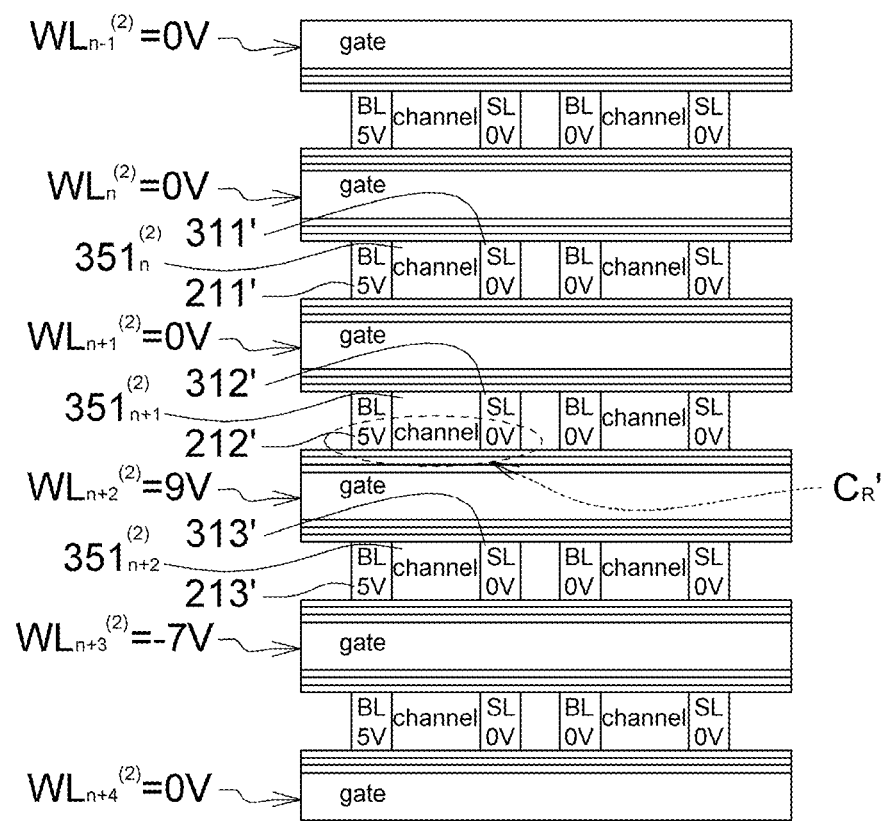
FIG. 7B is a top view of the second plane of the 3D stacked AND-type flash memory structure of FIG. 7A, and the cell is one-side programmed by CHE programming method.

FIG. 7A illustrates a cell of a 3D stacked AND-type flash memory structure according to the embodiment of the disclosure, capable of being operated as two bits per cell. FIG. 7B is a top view of the second plane of the 3D stacked AND-type flash memory structure of FIG. 7A, and the cell is one-side programmed by CHE programming method. Similarly, the dotted circle encloses the selected cell $C_R'$ at the second horizontal plane 12, and each channel is controlled by two nearby word lines. Some of the reference numerals used in FIG. 1, FIG. 2A~FIG. 2B and FIG. 6A~FIG. 6B are repeated in FIG. 7A~FIG. 7B where appropriate.

FIG. 7A and FIG. 7B also show representative operating voltages applied on the related and adjacent word lines, bit lines and source lines of the 3D structure when one-side programming is performed. It is of course known in the art that the voltage levels could be adjusted as suits a particular implementation for one-side CHE programming.

Similarly, as shown in FIG. 7B, the channel $351_{n+1}{}^{(2)}$ of the selected cell $C_R'$ is disposed between the bit line portion 212' and the source line portion 312'; the adjacent channel $351_n{}^{(2)}$ next to the channel $351_{n+1}{}^{(2)}$ of the selected cell $C_R'$ is disposed between the bit line portion 211' and the source line portion 311'; and the other adjacent channel $351_{n+2}{}^{(2)}$ next to the channel $351_{n+1}{}^{(2)}$ of the selected cell $C_R'$ is disposed between the bit line portion 213' and the source line portion 313'.

When one-side CHE programming of the selected cell $C_R'$ is performed (as enclosed by the region of FIG. 7B), only one word line $WL_{n+2}{}^{(2)}$ closest to the programming region is highly turned on (such as 9V) to induce a high vertical field to attract electrons, while the word line $WL_{n+1}{}^{(2)}$ is applied with 0V. Also, selected bit lines (i.e, the set of bit lines 21) are applied with about +5V to induce channel hot electrons at the selected cell $C_R'$.

Other unselected set of bit lines 22 and the sets of source lines 31 and 32 are applied with 0V. Other unselected word lines at the second horizontal plane 12 (such as $WL_{n-1}{}^{(2)}$, $WL_n{}^{(2)}$, $WL_{n+1}{}^{(2)}$, $WL_{n+4}{}^{(2)}$), and the word lines at the first and third horizontal planes 11 and 13, are applied with 0V (or below erased voltage Vt) to turn-off the cells.

Furthermore, in the embodiment, it is noted that one adjacent word line are applied with a negative voltage to guarantee the adjacent channel (i.e. next to the channel $351_{n+1}{}^{(2)}$ of the to-be-programmed cell) are completely turn-off. For example, the channel $351_{n+2}{}^{(2)}$ is completely turned-off by applying a negative voltage such as −7V to the adjacent word line $WL_{n+3}{}^{(2)}$.

Method for Manufacturing the 3D Stacked AND-Type Flash Memory Structure

FIG. 8A~FIG. 8F illustrate portions of process for manufacturing a 3D stacked AND-type flash memory structure according to an embodiment of the disclosure.

Figure 8A:
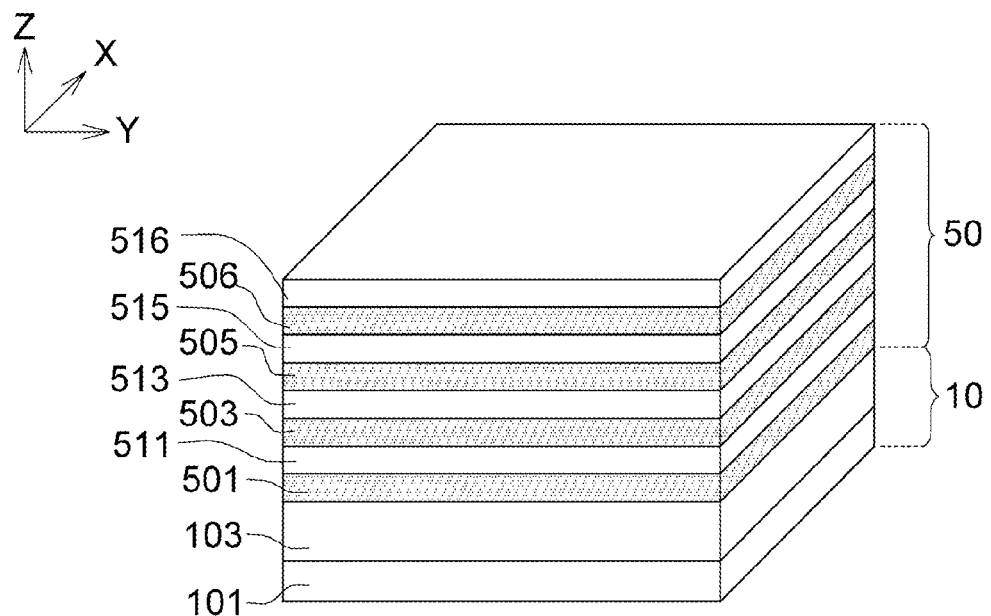
FIG. 8A~FIG. 8F illustrate portions of process for manufacturing a 3D stacked AND-type flash memory structure according to an embodiment of the disclosure.

In FIG. 8A, a substrate 10, such as a base 101 and a buried oxide 103 formed on the base 101, is provided. A multilayer stack 50, including alternating layers of the insulation layers (such as oxide layers) 511, 513, 515, 516 and the gate layers such as polysilicon gate layers 501, 503, 505, 506 as word line material, is then deposited on the buried oxide 103 of the substrate 10. In an embodiment, p-type poly gate is applied for the lower gate injection for BE-SONOS device.

Figure 8B:
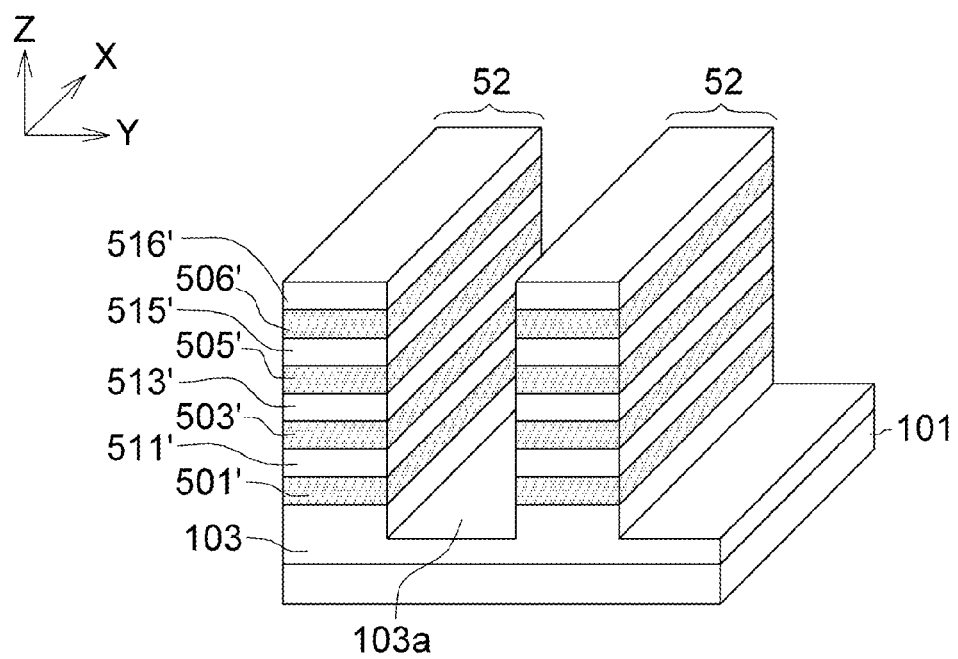

Subsequently, word line patterning is performed. FIG. 8B is a perspective view showing the result of word line patterning. The multilayer stack 50 of FIG. 8A is patterned using a first lithographic process to form several WL stacks 52 and expose part of a top surface 103a of the buried oxide 103. Each WL stack 52 as defined comprises alternating patterned polysilicon (poly-gate) layers 501', 503', 505', 506' as word lines and patterned insulation layers (/oxide layers) 511', 513', 515', 516' for isolating the word lines after patterning. Also, each WL stack 52 is elongated along the X-direction.

Figure 8C:
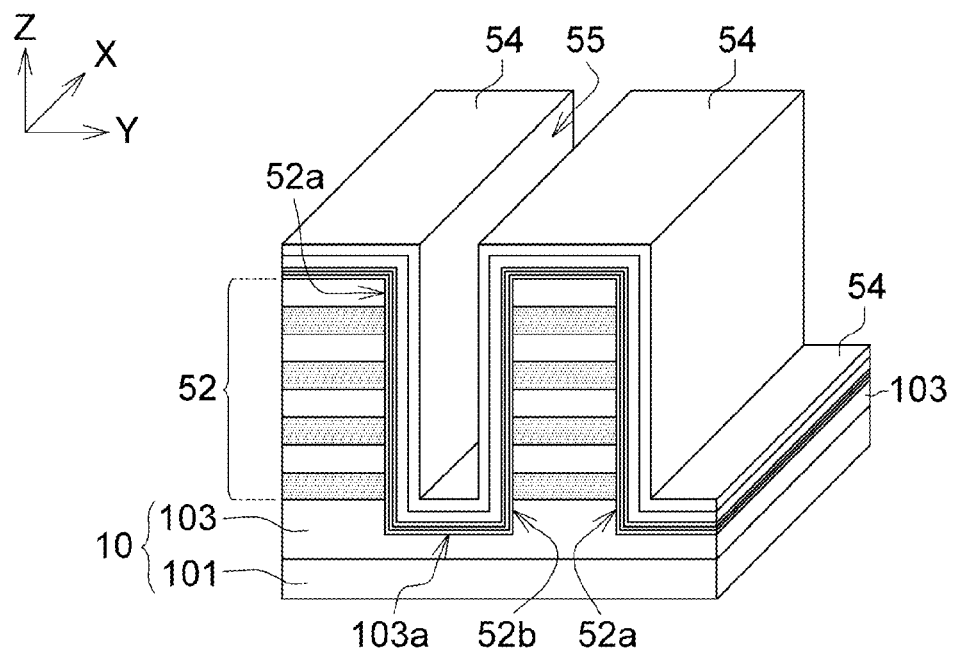

Next, a charge-trapping multilayer 54 (comprising such as ONO, ONONO or BE-SONOS laminated layers) is deposited on the WL stacks 52, for not only covering the tops of the WL stacks 52 but also lining the sidewalls 52a, 52b of the WL stacks 52 and the exposed parts of the top surface 103a of the buried oxide 103. FIG. 8C is a perspective view showing the result of charge-trapping multilayer deposition. After depositing the charge-trapping multilayer 54, the trenches 55 between the adjacent WL stacks 52 lined with the charge-trapping multilayer 54 are formed. In an embodiment, the trench 55 is about 20 nm in width, or larger than 20 nm in width.

Figure 8D:
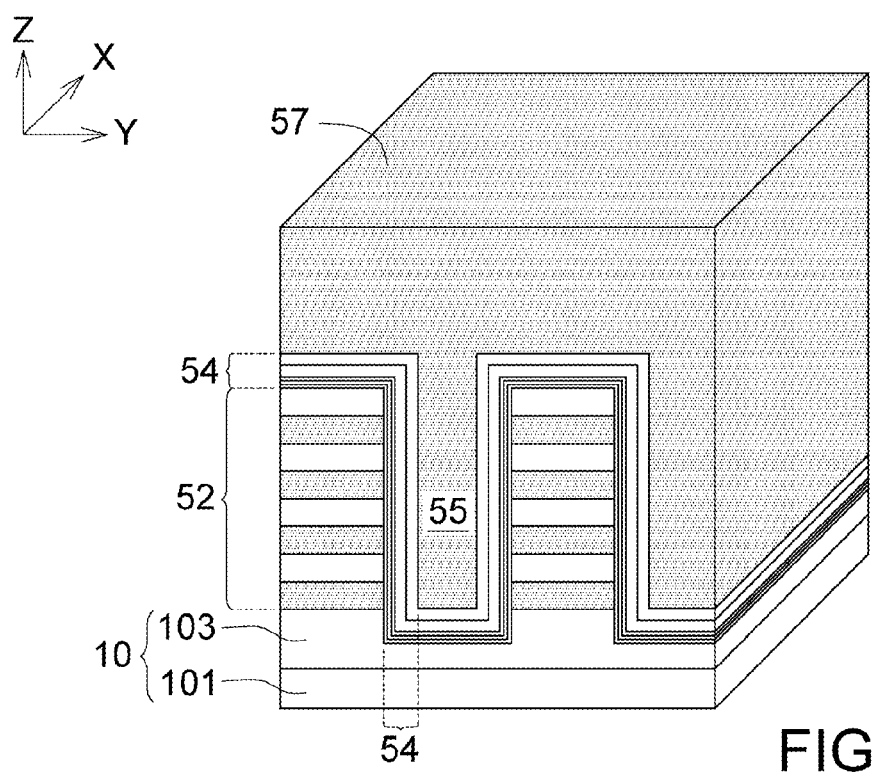

Subsequently, a conductive layer 57 (such as a polysilicon layer), such as p-type polysilicon with or without lightly doped, is deposited above the WL stacks 52, for covering the charge-trapping multilayer 54 and filling the trenches 55. FIG. 8D is a perspective view showing the result of conductive layer deposition. The conductive layer 57 contacts the charge-trapping multilayer 54 after conductive layer deposition.

Figure 8E:
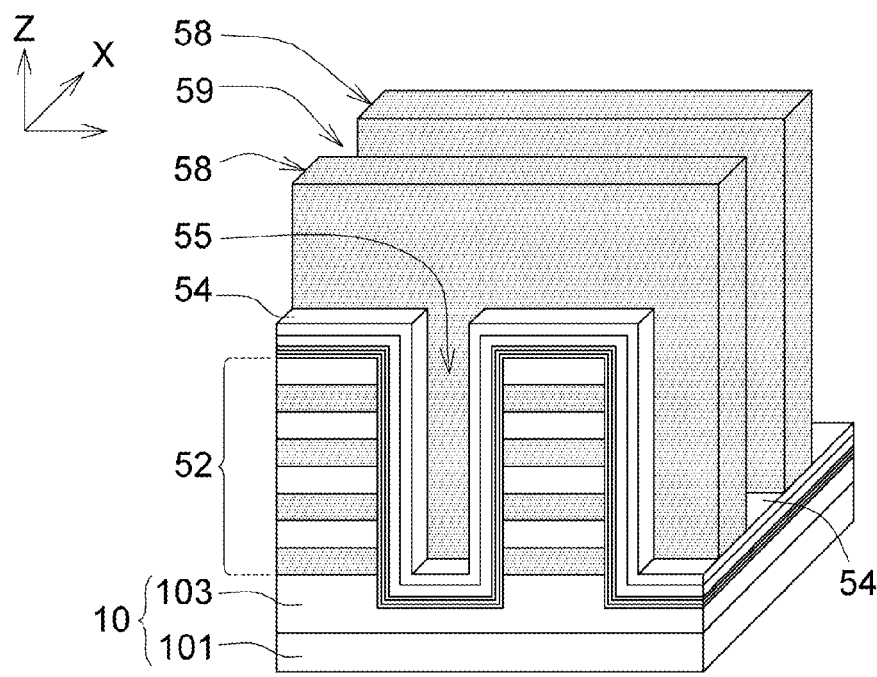

Next, the conductive layer 57 is patterned to form a plurality of BL stacks 58, as shown in FIG. 8E. FIG. 8 E is a perspective view showing the result of BL stacks patterning. After, patterning the conductive layer 57, the BL stacks 58 are spaced apart alternately by a gap 59, and partial surface of the charge-trapping multilayer 54 is exposed. Also, each BL stacks 58 is elongated along the Y-direction.

Please referred to FIG. 8B and FIG. 8E. After patterning the conductive layer 57 to form the BL stacks 58, an elongating direction (i.e. Y-direction) of each BL stack 58 is perpendicular to an elongating direction (i.e. X-direction) of each WL stack 52. Also, an elongating direction (i.e. X-direction) of each trench 55 between the WL stacks 52 is perpendicular to an elongating direction (i.e. Y-direction) of each gap 59 between the BL stacks 58.

Figure 8F:
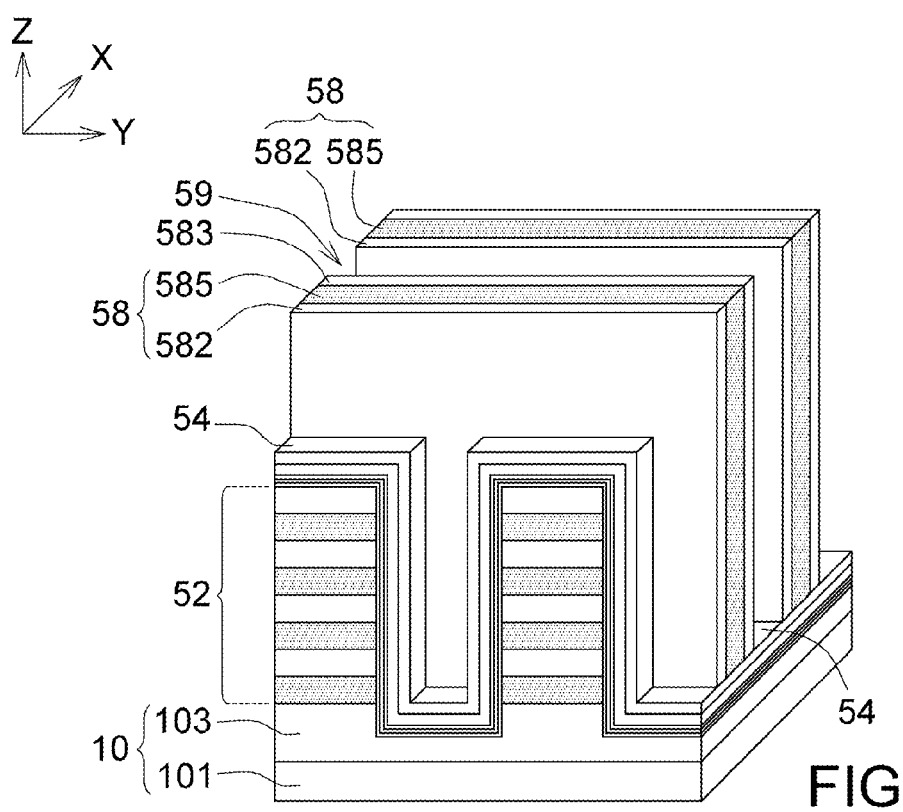

Afterwards, two doped regions 582 and 583 (such as n+ doped) at two sides of each BL stack 58 are formed, and a channel 585 vertically sandwiched between the two doped regions 582 and 583. In an embodiment, the channel 585 sandwiched between the two doped regions 582 and 583 is a lightly doped p-type channel. During the doping step, two sides of each BL stack 58 and exposed part of the charge-trapping multilayer 54 at the gap 59 between adjacent BL stacks 58 are doped, so as to form two spacers such as poly spacers (i.e. 582 and 583) as the bit line and the source line of each BL stack 58, and form a bottom spacer (not shown in FIG. 8F) at the gap 59 between adjacent BL stacks 58. Then, the bottom spacer at the gap 59 between adjacent BL stacks 58 is removed, such as by etching, to isolate the adjacent BL stacks 58 from each other. FIG. 8F is a perspective view showing the result of bit lines and source lines formation after bottom spacer removing. After bottom spacer removing, the partial surface of the charge-trapping multilayer 54 is exposed.

As shown in FIG. 8F, each channel 585 of the BL stacks 58 is vertically disposed on the charge-trapping multilayer 54. Also, the channel 585 is extended along the Y-direction, which is perpendicular to each word line (extended along the X-direction) of the WL stacks 52.

Accordingly, the method for manufacturing the 3D stacked AND-type flash memory structure of the embodiment as disclosed above is simple and time-saving. The process flow of the manufacturing method forms the word line patterning (as shown in FIG. 8B) prior to the bit line patterning (as shown in FIG. 8E). Also, the word lines at several horizontal planes of the 3D stacked AND-type flash memory structure can be quickly and accurately formed by one lithography process (please see FIG. 8A~FIG. 8B). The patterns of the bit line, source line and channels vertical to the substrate can be quickly and accurately formed by another one lithography process. Thus, the manufacturing method of the embodiment can be completely self-aligned with only two lithograph steps, thus saving the processing cost for making 3D stacked AND-type flash memory structure.

Variations of 3D Stacked AND-Type Flash Memory Structure

Figure 9:
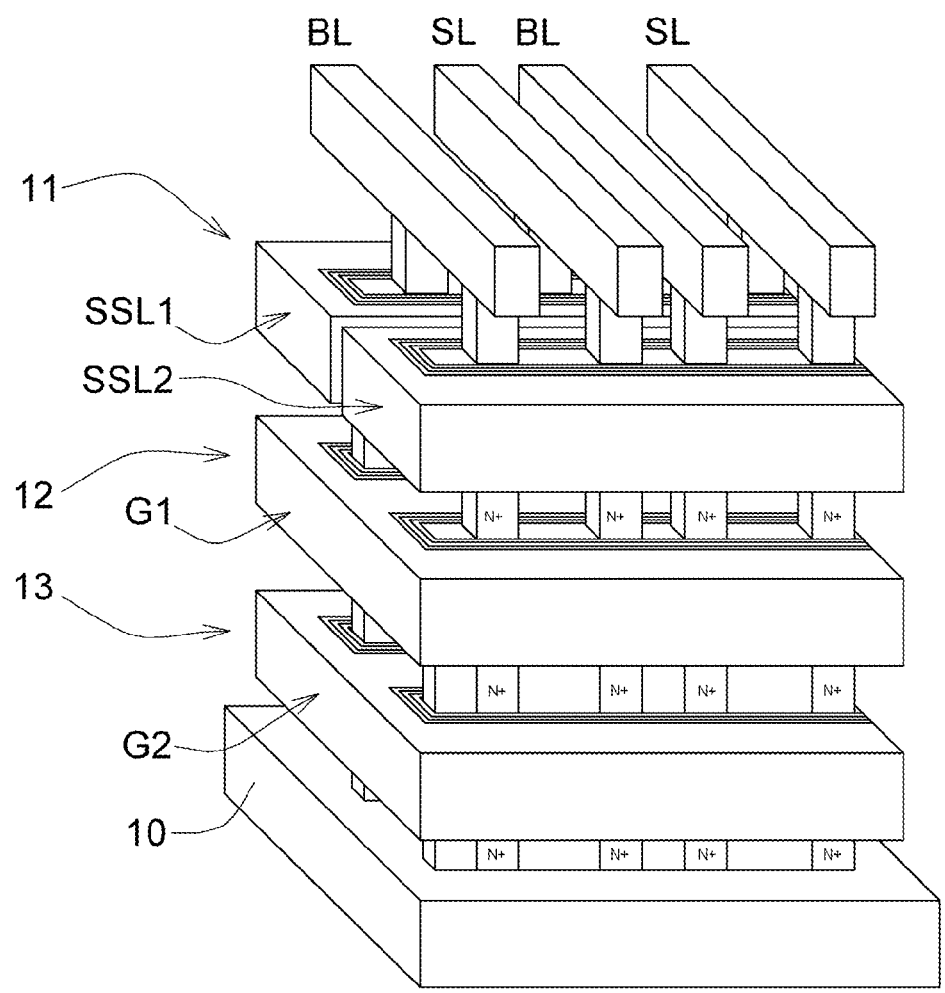
FIG. 9 shows a portion of a variation of the 3D stacked AND-type flash memory structure according to the embodiment of the present disclosure.

The 3D stacked AND-type flash memory structure according to the aforementioned embodiments can be slightly modified. Please refer to FIG. 1 and FIG. 9 together. FIG. 9 shows a portion of one variation of the 3D stacked AND-type flash memory structure according to the embodiment of the present disclosure. With the additional help of the SSL (Secure Sockets Layer) selection transistors, the bit line (BL) selection can be easier. As the 3D stacked AND-type flash memory structure 60 shown in FIG. 9, the first selection transistor SSL and the second selection transistor SSL2 are formed on top of the array (i.e. the first horizontal plane 11), and the word lines in the same layer can be simply common to make WL decoder easier and simpler. For example, the word lines in the second horizontal plane 12 are electrically connected to form a first common gate G1, while the word lines in the third horizontal plane 13 are electrically connected to form a first common gate G2. Also, the 3D stacked AND-type flash memory structure 60 of FIG. 9 is operable by the CHE programming method or the FN programming a method.

Figure 10:
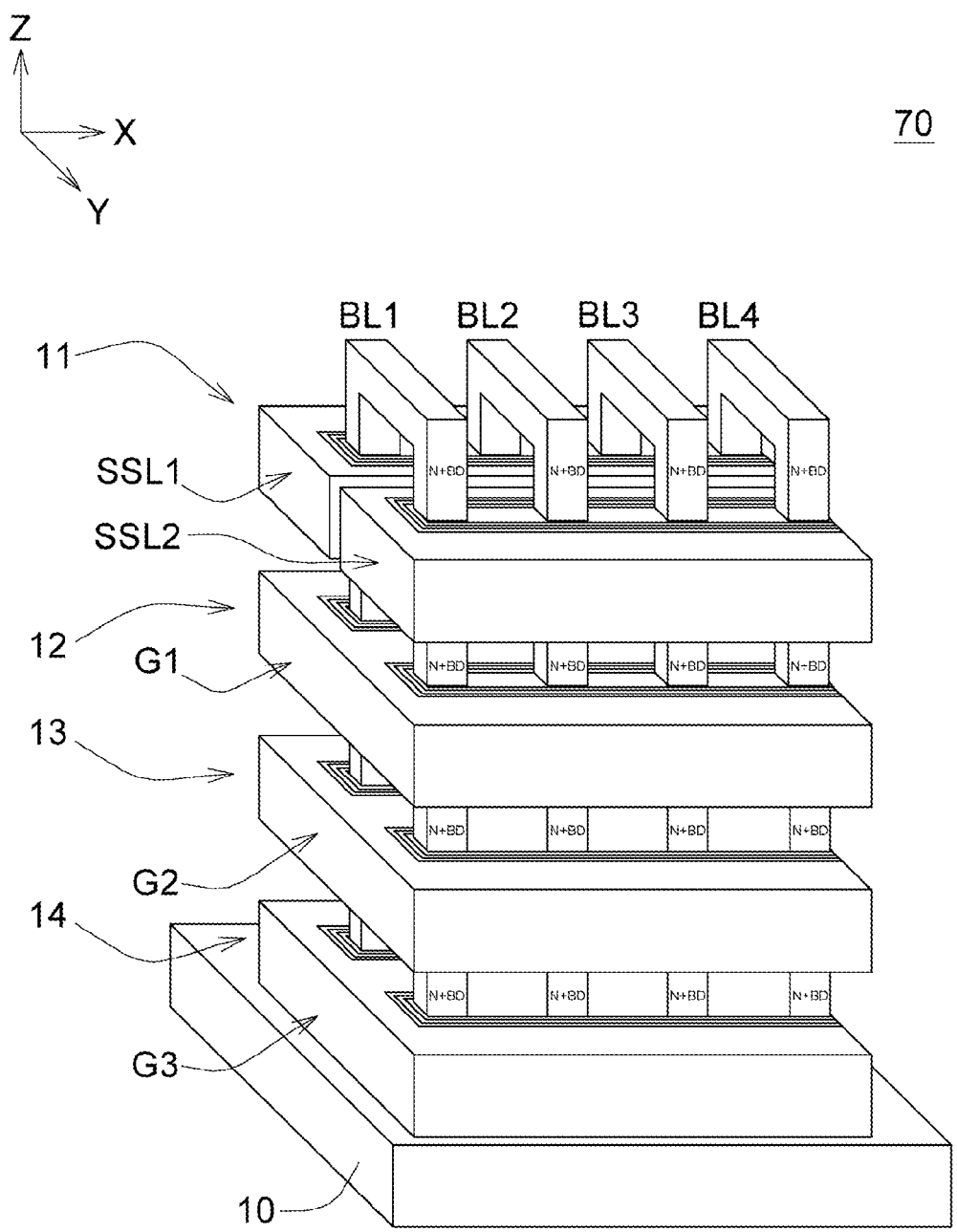
FIG. 10 shows a portion of another variation of the 3D stacked AND-type flash memory structure according to the embodiment of the present disclosure.

The 3D stacked AND-type flash memory structure according to the aforementioned embodiments can be further slightly modified to be a virtual-ground AND-type array. Please refer to FIG. 1 and FIG. 10 together. FIG. 10 shows a portion of another variation of the 3D stacked AND-type flash memory structure according to the embodiment of the present disclosure. As the 3D stacked AND-type flash memory structure 70 shown in FIG. 10, the first selection transistor SSL and the second selection transistor SSL2 are formed on top of the array (i.e. the first horizontal plane 11), and the word lines in the same layer can be simply common to make WL decoder easier and simpler. For example, the word lines in the second horizontal plane 12, the third horizontal plane 13 and the fourth horizontal plane 14 are electrically connected to form a first common gate G1, a first common gate G2 and a third common gate G3, respectively. Also, two adjacent buried BL and SL of the structure 70 of FIG. 10 (ex: the adjacent buried bit line portion 222b and buried source line portion 322b) are electrically connected, so as to form a type of virtual-ground AND-type array (where the BL and SL are common together). The 3D stacked AND-type flash memory structure 70 of FIG. 10 is also operable by the CHE programming method or the FN programming a method. The variations of structures 60 and 70 that uses the SSL selection transistors (SSL1 & SSL2) on top of the array can facilitate the WL decoding more simply.

According to the aforementioned description, the 3D stacked AND-type flash memory structure, and methods of operating and manufacturing the same are exemplified. The 3D stacked AND-type flash memory structure has vertical channels, sandwiched between the buried bit lines (such as n+ doped) and the buried source lines (such as n+ doped). The MOSFET of the 3D stacked AND-type flash memory structure are connected in parallel instead of serially connected in the NAND-type flash memory structure; thus, the read speed of the 3D stacked AND-type flash memory structure is better than that of the NAND-type flash memory structure. Also, the 3D stacked AND-type flash memory structure of the embodiment can be programmed by channel hot electron programming (CHE) method like NOR Flash, or programmed by FN (Fowler-Nordheim) tunneling method like NAND Flash. Generally, the structure manufactured is suitable for one-bit per cell and two-bit per cell operations. Since the structure is a double-gated charge-trapping device, and the double gates could be independently decoded to carry out the two bit/cell operation. Furthermore, the method for manufacturing the 3D stacked AND-type flash memory structure of the embodiment can be self-aligned simply with only two lithograph steps, thereby saving the processing time and cost.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3D stacked AND-type flash memory structure, comprising:
   a plurality of horizontal planes of memory cells arranged in a three-dimensional array, and each horizontal plane comprising a plurality of word lines and a plurality of charge trapping multilayers alternately arranged, and the adjacent word lines spaced apart from each other with each charge trapping multilayer interposed between;
   a plurality of sets of bit lines and sets of source lines arranged alternately and disposed vertically to the horizontal planes; and
   a plurality of sets of channels and sets of insulation pillars arranged alternatively, and disposed perpendicularly to the horizontal planes, and one set of channels sandwiched between the adjacent sets of bit lines and source lines.

2. The structure according to claim 1, wherein each set of bit lines comprises a plurality of bit line pillars disposed vertically to the horizontal planes.

3. The structure according to claim 2, wherein each set of source lines comprises a plurality of source line pillars disposed vertically to the horizontal planes.

4. The structure according to claim 3, wherein each charge trapping multilayer of each horizontal plane surround the insulation pillars, the bit line pillars and source line pillars, and the channels.

5. The structure according to claim 1, wherein each set of bit lines is disposed between the adjacent set of insulation pillars and the set of channels, while each set of insulation pillars is disposed between the adjacent set of bit lines and set of source lines.

6. The structure according to claim 1, wherein each set of bit lines comprises a plurality of buried bit line portions respectively disposed between the adjacent horizontal planes.

7. The structure according to claim 6, wherein each set of source lines comprises buried source line portions disposed between the adjacent horizontal planes respectively.

8. The structure according to claim 7, wherein each set of channels comprises a plurality of vertical channel regions, and each channel region is sandwiched between the adjacent buried bit line portion and buried source line portion.

9. The structure according to claim 1, wherein the word lines and the sets of channels comprise polysilicon, the sets of insulation pillars comprise oxide, and the sets of bit lines and source lines comprise n-F doped polysilicon.

10. A method for manufacturing 3D stacked AND-type flash memory structure, the method at least comprising:
   providing a substrate;
   depositing a plurality of gate layers and insulation layers alternately on the substrate;
   patterning the gate layers and insulation layers to form a plurality of WL stacks, and each WL stacks comprising alternating patterned gate layers as word lines and patterned insulation layers for isolating the word lines after patterning;
   forming a charge-trapping multilayer on the WL stacks, lining the sidewalls of the WL stacks, and forming trenches between the WL stacks lined with the charge-trapping multilayer;
   depositing a conductive layer on the WL stacks and filling up the trenches;
   patterning the conductive layer to form a plurality of BL stacks, and the BL stacks being spaced apart alternately by a plurality of gaps; and
   forming two doped regions at two sides of each BL stack, and a channel vertically sandwiched between the two doped regions, wherein the adjacent BL stacks are isolated from each other.

11. The method according to claim 10, wherein in the step of patterning the conductive layer to form the BL stacks, part of the charge-trapping multilayer is exposed after patterning.

12. The method according to claim 10, wherein the step of forming two doped regions at two sides of each BL stack comprises:
   doping two sides of each BL stack and exposed part of the charge-trapping multilayer at the gap between adjacent BL stacks, so as to form two spacers as the bit line and the source line of each BL stack, and form a bottom spacer at the gap between adjacent BL stacks; and
   removing the bottom spacer at the gap between adjacent BL stacks to isolate the adjacent BL stacks from each other, wherein the part of the charge-trapping multilayer is exposed after bottom spacer removing.

13. The method according to claim 10, wherein each channel of the BL stack is vertically disposed on the charge-trapping multilayer.

14. The method according to claim 10, wherein the insulation layers are a plurality of oxide layers, and the charge-trapping multilayer is an oxide-nitrite-oxide-nitrite-oxide (ONONO) laminated layer.

15. The method according to claim 10, wherein the two sides of each BL stack are n+ doped regions.

16. The method according to claim 10, wherein the channel sandwiched between the two doped regions is a lightly doped p-type channel.

17. A method for operating 3D stacked AND-type flash memory structure, comprising:
   providing a 3D stacked AND-type flash memory structure comprising a plurality of horizontal planes of memory cells arranged in a three-dimensional array, a plurality of sets of bit lines and sets of source lines arranged alternately and disposed vertically to the horizontal planes, and a plurality of sets of channels and sets of insulation pillars arranged alternatively and disposed perpendicularly to the horizontal planes, wherein each horizontal plane comprises a plurality of word lines and a plurality of charge trapping multilayers alternately arranged, and the adjacent word lines are spaced apart from each other with each charge trapping multilayer interposed between, and one set of channels is sandwiched between the adjacent sets of bit lines and source lines;
   selecting a memory cell positioned at one of the horizontal planes;
   applying an operating voltage to each of two word lines adjacent to the selected memory cell at the horizontal plane to turn on the selected memory cell;
   turning off at least one of two channels adjacent to the outsides of said two conducting word lines; and
   applying a relative voltage to at least selected one of the sets of bit lines and sets of source lines, and applying 0 voltage to other plural unselected sets of bit lines and unselected sets of source lines.

18. The method according to claim 17, wherein the operating voltages applied to said two word lines adjacent to the selected memory cell are between an erasing voltage and a programming voltage while reading or programming of the selected memory cell is performed.

19. The method according to claim 18, wherein a high negative voltage is applied to each of two selected adjacent set of bit lines and set of source lines, and other unselected sets of bit lines and unselected sets of source lines are applied with 0 voltage while FN programming of the selected memory cell is performed.

20. The method according to claim 17, wherein a negative voltage is applied to each of two channels adjacent to the outsides of said two conducting word lines.

21. The method according to claim 17, wherein plural unselected word lines at the selected horizontal plane having the selected memory cell are applied with 0 voltage or voltages lower than an erasing voltage, to turn off other unselected memory cells.

22. The method according to claim 17, further comprising:
   turning off all unselected memory cells positioned at other unselected horizontal planes.

23. The method according to claim 17, further comprising:
   applying 0 voltage to all word lines at the horizontal planes, and applying a high positive voltage to each of the sets of bit lines and the sets of source lines for performing a FN erase to all of the memory cells.

* * * * *